US007480062B2

(12) United States Patent
Li et al.

(10) Patent No.: US 7,480,062 B2
(45) Date of Patent: Jan. 20, 2009

(54) AUTOMATED PROCESS CONTROL USING PARAMETERS DETERMINED FROM A PHOTOMASK COVERED BY A PELLICLE

(75) Inventors: Shifang Li, Pleasanton, CA (US); Sanjay Yedur, Fremont, CA (US); Manuel Madriaga, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 18 days.

(21) Appl. No.: 11/754,225

(22) Filed: May 25, 2007

(65) Prior Publication Data

US 2008/0291429 A1 Nov. 27, 2008

(51) Int. Cl.
*G01B 11/02* (2006.01)
*G01B 11/06* (2006.01)

(52) U.S. Cl. .................. 356/625; 356/601; 356/636; 702/23; 702/127; 438/14

(58) Field of Classification Search ......... 356/601–636; 250/339.11, 339.08; 438/14, 16; 702/23, 702/127, 155, 179
See application file for complete search history.

(56) References Cited

U.S. PATENT DOCUMENTS

| | | | | |
|---|---|---|---|---|
| 4,870,289 A | * | 9/1989 | Sato et al. ............ | 250/548 |
| 5,182,610 A | * | 1/1993 | Shibata ................ | 356/490 |
| 5,703,675 A | * | 12/1997 | Hirukawa et al. ....... | 355/53 |
| 6,423,479 B1 | * | 7/2002 | Subramanian et al. ... | 430/329 |
| 6,772,084 B2 | * | 8/2004 | Bischoff et al. ........ | 702/127 |
| 6,791,679 B2 | * | 9/2004 | Engelhard et al. ...... | 356/124 |
| 6,853,942 B2 | * | 2/2005 | Drege et al. ........... | 702/119 |
| 7,372,583 B1 | * | 5/2008 | Jin et al. ............. | 356/625 |
| 7,417,750 B2 | * | 8/2008 | Vuong et al. .......... | 356/636 |
| 7,450,232 B2 | * | 11/2008 | Li et al. .............. | 356/369 |

OTHER PUBLICATIONS

U.S. Appl. No. 11/485,045, Wen.
U.S. Appl. No. 11/753,496, Li.

* cited by examiner

*Primary Examiner*—Sang Nguyen
(74) *Attorney, Agent, or Firm*—Manuel B. Madriaga

(57) ABSTRACT

Provided is a method of controlling a photolithography cluster or a subsequent fabrication cluster using optical metrology to determine profile parameters of a photomask structure covered with a pellicle. An optical metrology model of the pellicle is developed and integrated with the optical metrology model of the photomask structure. The optical metrology model of the photomask taking into account the optical effects on the illumination and detection beams transmitted through the pellicle and diffracted by the photomask structure. One or more profile parameters of the photomask structure is determined and used to adjust one or more process parameters or equipment settings of a photolithography cluster using the photomask or a subsequent fabrication cluster.

14 Claims, 11 Drawing Sheets

US 7,480,062 B2

AUTOMATED PROCESS CONTROL USING PARAMETERS DETERMINED FROM A PHOTOMASK COVERED BY A PELLICLE

BACKGROUND

1. Field

The present application generally relates to optical metrology of a structure formed on a semiconductor wafer, and, more particularly, to determining one or more profile parameters of a patterned photomask covered by a pellicle using optical metrology.

2. Related Art

In semiconductor manufacturing, periodic gratings are typically used for quality assurance. For example, one typical use of periodic gratings includes fabricating a periodic grating in proximity to the operating structure of a semiconductor chip. The periodic grating is then illuminated with an electromagnetic radiation. The electromagnetic radiation that deflects off of the periodic grating are collected as a diffraction signal. The diffraction signal is then analyzed to determine whether the periodic grating, and by extension whether the operating structure of the semiconductor chip, has been fabricated according to specifications.

In one conventional system, the diffraction signal collected from illuminating the periodic grating (the measured diffraction signal) is compared to a library of simulated diffraction signals. Each simulated diffraction signal in the library is associated with a hypothetical profile. When a match is made between the measured diffraction signal and one of the simulated diffraction signals in the library, the hypothetical profile associated with the simulated diffraction signal is presumed to represent the actual profile of the periodic grating.

The hypothetical profiles, which are used to generate the simulated diffraction signals, are generated based on a profile model that characterizes the structure to be examined. Thus, in order to accurately determine the profile of the structure using optical metrology, a profile model that accurately characterizes the structure should be used.

SUMMARY

Provided is a method of determining one or more profile parameters of a photomask covered with a pellicle, the method comprising developing an optical metrology model of a pellicle covering a photomask, developing an optical metrology model of the photomask, the photomask separated from the pellicle by a medium and having a structure, the structure having profile parameters, the optical metrology model of the photomask taking into account the optical effects on the illumination beam transmitted through the pellicle and diffracted by the photomask structure. The optical metrology model of the pellicle and the optical metrology model of the photomask structure are integrated and optimized. At least one profile parameters of the photomask structure is determined using the optimized integrated optical metrology model.

BRIEF DESCRIPTION OF DRAWINGS

FIG. 4A is an exemplary architectural diagram of the optical model of the pellicle whereas

DETAILED DESCRIPTION OF EXEMPLARY EMBODIMENT(S)

In order to facilitate the description of the present invention, a semiconductor wafer may be utilized to illustrate an application of the concept. The methods and processes equally apply to other work pieces that have repeating structures. Furthermore, in this application, the term structure when it is not qualified refers to a patterned structure.

Figure 1A:
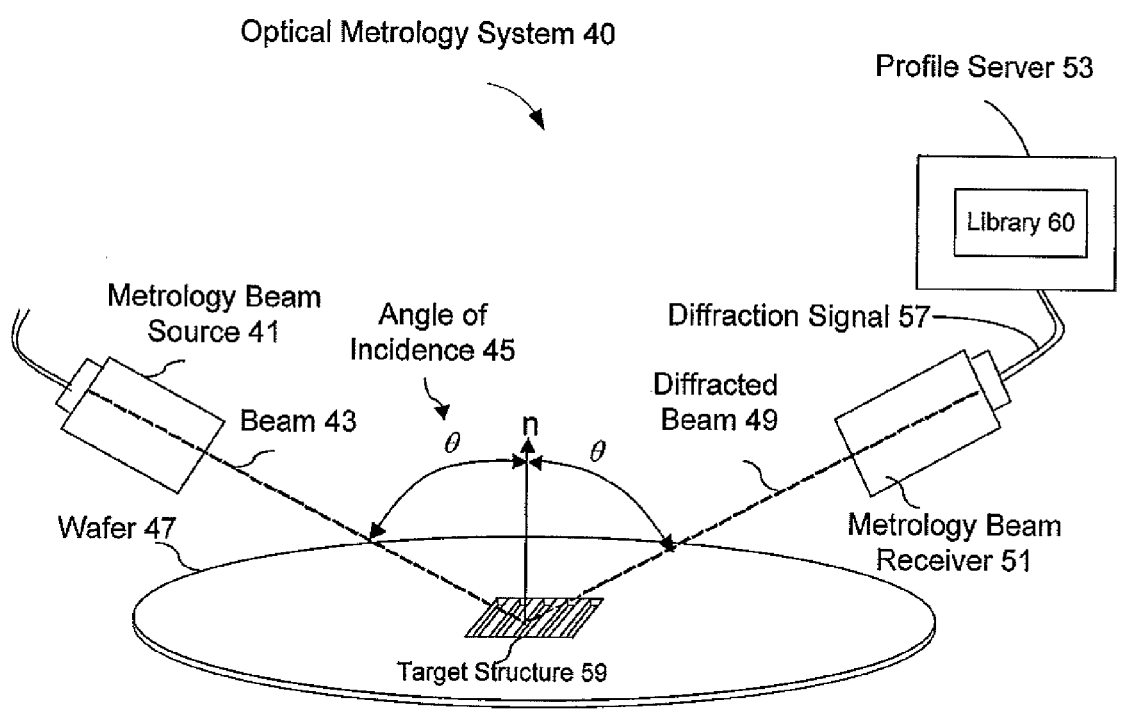
FIG. 1A is an architectural diagram illustrating an exemplary embodiment where optical metrology can be utilized to determine the profiles of structures formed on a semiconductor wafer.

FIG. 1A is an architectural diagram illustrating an exemplary embodiment where optical metrology can be utilized to determine the profiles or shapes of structures fabricated on a semiconductor wafer. The optical metrology system 40 includes a metrology beam source 41 projecting a metrology beam 43 at the target structure 59 of a wafer 47. The metrology beam 43 is projected at an incidence angle θ towards the target structure 59. The diffracted beam 49 is measured by a metrology beam receiver 51. A measured diffraction signal 57 is transmitted to a profile server 53. The profile server 53 compares the measured diffraction signal 57 against a library 60 of simulated diffraction signals and associated hypothetical profiles representing varying combinations of critical dimensions of the target structure and resolution. In one exemplary embodiment, the library 60 instance best matching the measured diffraction signal 57 is selected. The hypothetical profile and associated critical dimensions of the selected library 60 instance are assumed to correspond to the actual cross-sectional shape and critical dimensions of the features of the target structure 59. The optical metrology system 40 may utilize a reflectometer, an ellipsometer, or other optical metrology device to measure the diffraction beam or signal. An optical metrology system is described in U.S. Pat. No. 6,913,900, entitled GENERATION OF A LIBRARY OF PERIODIC GRATING DIFFRACTION SIGNAL, issued on Sep. 13, 2005, which is incorporated herein by reference in its entirety.

Simulated diffraction signals can be generated by applying Maxwell's equations and using a numerical analysis technique to solve Maxwell's equations. It should be noted that various numerical analysis techniques, including variations of rigorous coupled wave analysis (RCWA), can be used. For a more detail description of RCWA, see U.S. Pat. No. 6,891,626, titled CACHING OF INTRA-LAYER CALCULATIONS FOR RAPID RIGOROUS COUPLED-WAVE ANALYSES, filed on Jan. 25, 2001, issued May 10, 2005, which is incorporated herein by reference in its entirety.

Simulated diffraction signals can also be generated using a machine learning system (MLS). Prior to generating the simulated diffraction signals, the MLS is trained using known input and output data. In one exemplary embodiment, simulated diffraction signals can be generated using an MLS employing a machine learning algorithm, such as back-propagation, radial basis function, support vector, kernel regression, and the like. For a more detailed description of machine learning systems and algorithms, see U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

Figure 1B:
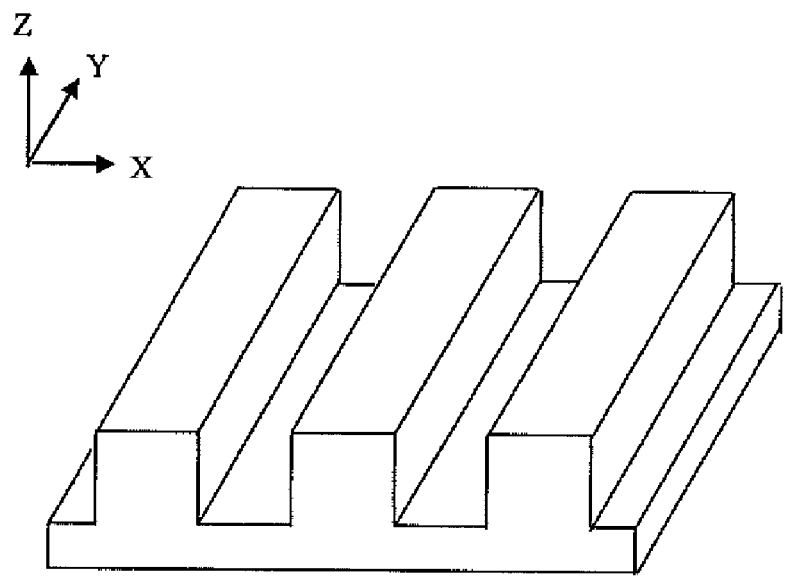
FIG. 1B depicts an exemplary one-dimension repeating structure.

The term "one-dimension structure" is used herein to refer to a structure having a profile that varies in one dimension. For example, FIG. 1B depicts a periodic grating having a profile that varies in one dimension (i.e., the x-direction). The profile of the periodic grating depicted in FIG. 1B varies in the z-direction as a function of the x-direction. However, the profile of the periodic grating depicted in FIG. 1B is assumed to be substantially uniform or continuous in the y-direction.

Figure 1C:
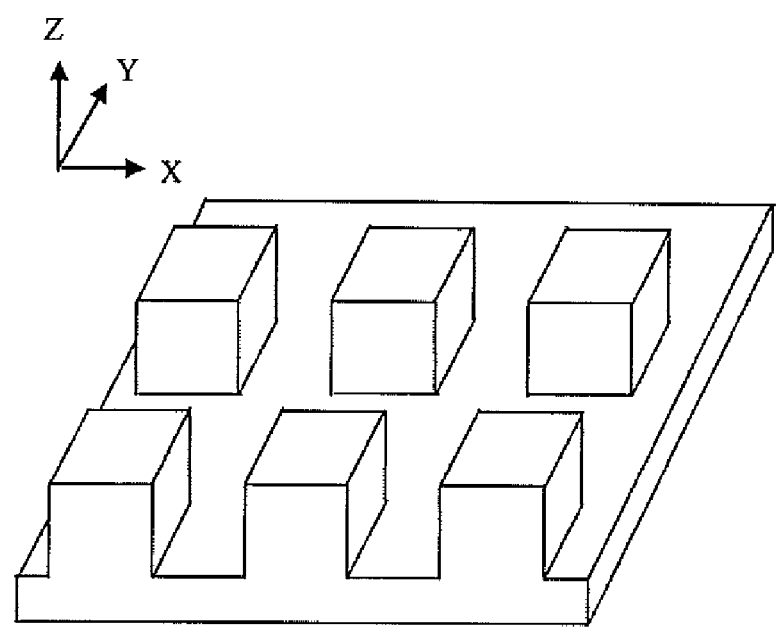
FIG. 1C depicts an exemplary two-dimension repeating structure

The term "two-dimension structure" is used herein to refer to a structure having a profile that varies in two-dimensions. For example, FIG. 1C depicts a periodic grating having a profile that varies in two dimensions (i.e., the x-direction and the y-direction). The profile of the periodic grating depicted in FIG. 1C varies in the z-direction.

Figure 2A:
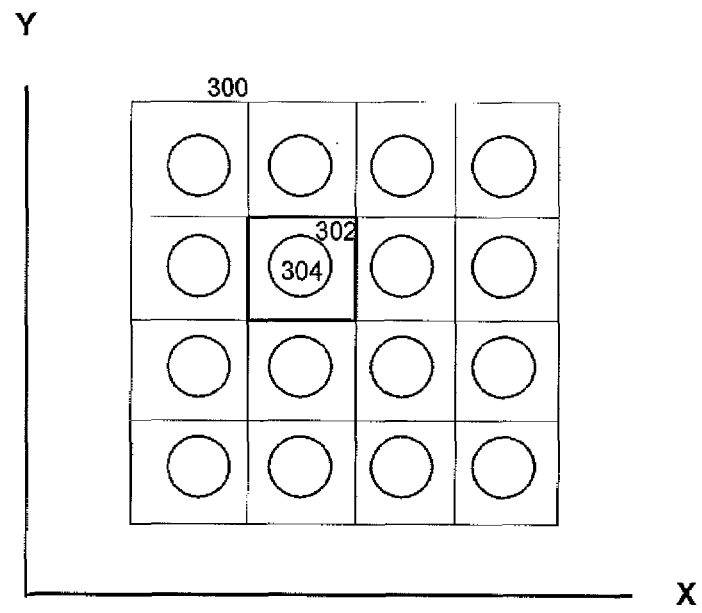
FIG. 2A depicts exemplary orthogonal grid of unit cells of a two-dimension repeating structure.

Discussion for FIGS. 2A, 2B, and 2C below describe the characterization of two-dimension repeating structures for optical metrology modeling. FIG. 2A depicts a top-view of exemplary orthogonal grid of unit cells of a two-dimension repeating structure. A hypothetical grid of lines is superimposed on the top-view of the repeating structure where the lines of the grid are drawn along the direction of periodicity. The hypothetical grid of lines forms areas referred to as unit cells. The unit cells may be arranged in an orthogonal or non-orthogonal configuration. Two-dimension repeating structures may comprise features such as repeating posts, contact holes, vias, islands, or combinations of two or more shapes within a unit cell. Furthermore, the features may have a variety of shapes and may be concave or convex features or a combination of concave and convex features. Referring to FIG. 2A, the repeating structure 300 comprises unit cells with holes arranged in an orthogonal manner. Unit cell 302 includes all the features and components inside the unit cell 302, primarily comprising a hole 304 substantially in the center of the unit cell 302.

Figure 2B:
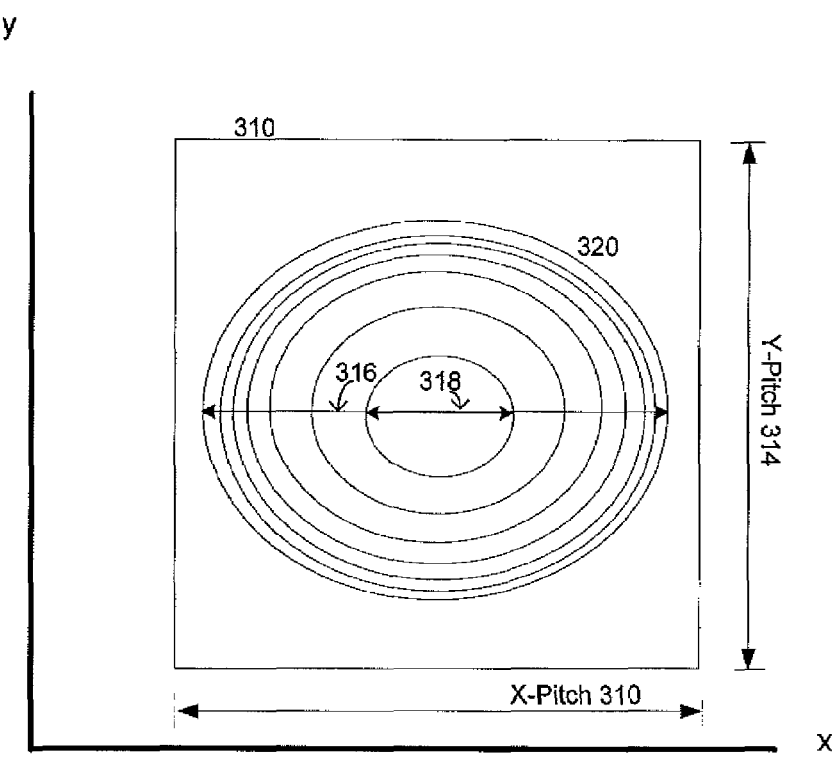
FIG. 2B depicts a top-view of a two-dimension repeating structure.

FIG. 2B depicts a top-view of a two-dimension repeating structure. Unit cell 310 includes a concave elliptical hole. In FIG. 2B, unit cell 310 includes a feature 320 that comprises an elliptical hole, where the dimensions become progressively smaller until the bottom of the hole. Profile parameters used to characterize the structure includes the X-pitch 310 and the Y-pitch 314. In addition, the major axis of the ellipse 316 that represents the top of the feature 320 and the major axis of the ellipse 318 that represents the bottom of the feature 320 may be used to characterize the feature 320. Furthermore, any intermediate major axis between the top and bottom of the feature may also be used as well as any minor axis of the top, intermediate, or bottom ellipse, (not shown).

Figure 2C:
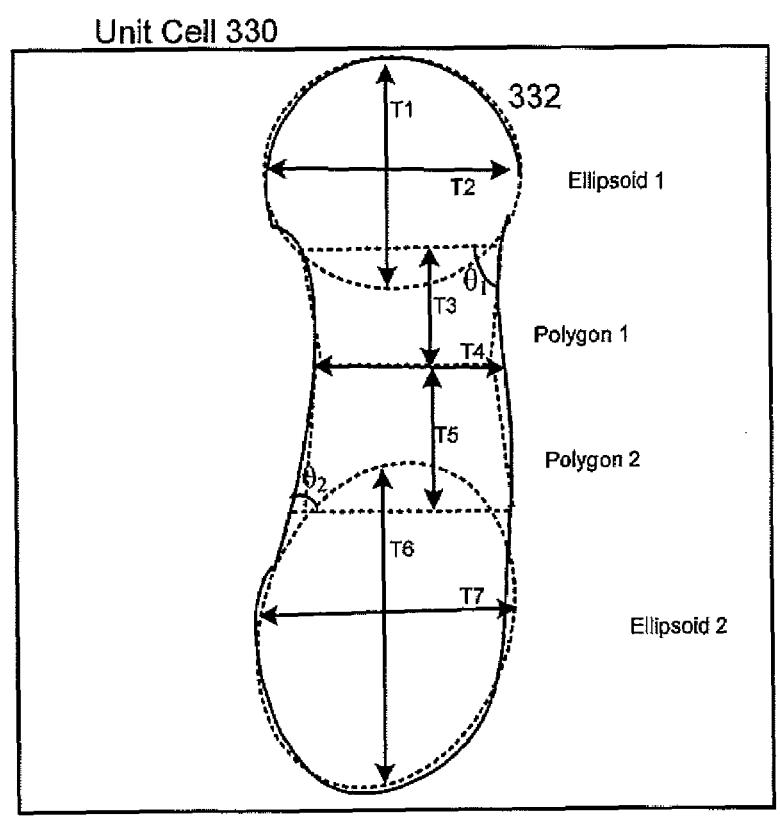
FIG. 2C is an exemplary technique for characterizing the top-view of a two-dimension repeating structure.

FIG. 2C is an exemplary technique for characterizing the top-view of a two-dimension repeating structure. Unit cell 330 includes a feature 332, an island with a peanut-shape viewed from the top. One modeling approach includes approximating the feature 332 with a variable number or combinations of ellipses and polygons. Assume further that after analyzing the variability of the top-view shape of the feature 332, it was determined that two ellipses, Ellipsoid 1 and Ellipsoid 2, and two polygons, Polygon 1 and Polygon 2, were found to fully characterize feature 332. In turn, parameters needed to characterize the two ellipses and two polygons comprise nine parameters as follows: T1 and T2 for Ellipsoid 1; T3, T4, and $\theta_1$ for Polygon 1; T4, T5, and $\theta_2$ for Polygon 2; and T6 and T7 for Ellipsoid 2. Many other combinations of shapes could be used to characterize the top-view of the feature 332 in unit cell 330. For a detailed description of modeling two-dimension repeating structures, refer to U.S. patent application Ser. No. 11/061,303, OPTICAL METROLOGY OPTIMIZATION FOR REPETITIVE STRUCTURES, filed on Apr. 27, 2004, which is incorporated herein by reference in its entirety.

Figure 3:
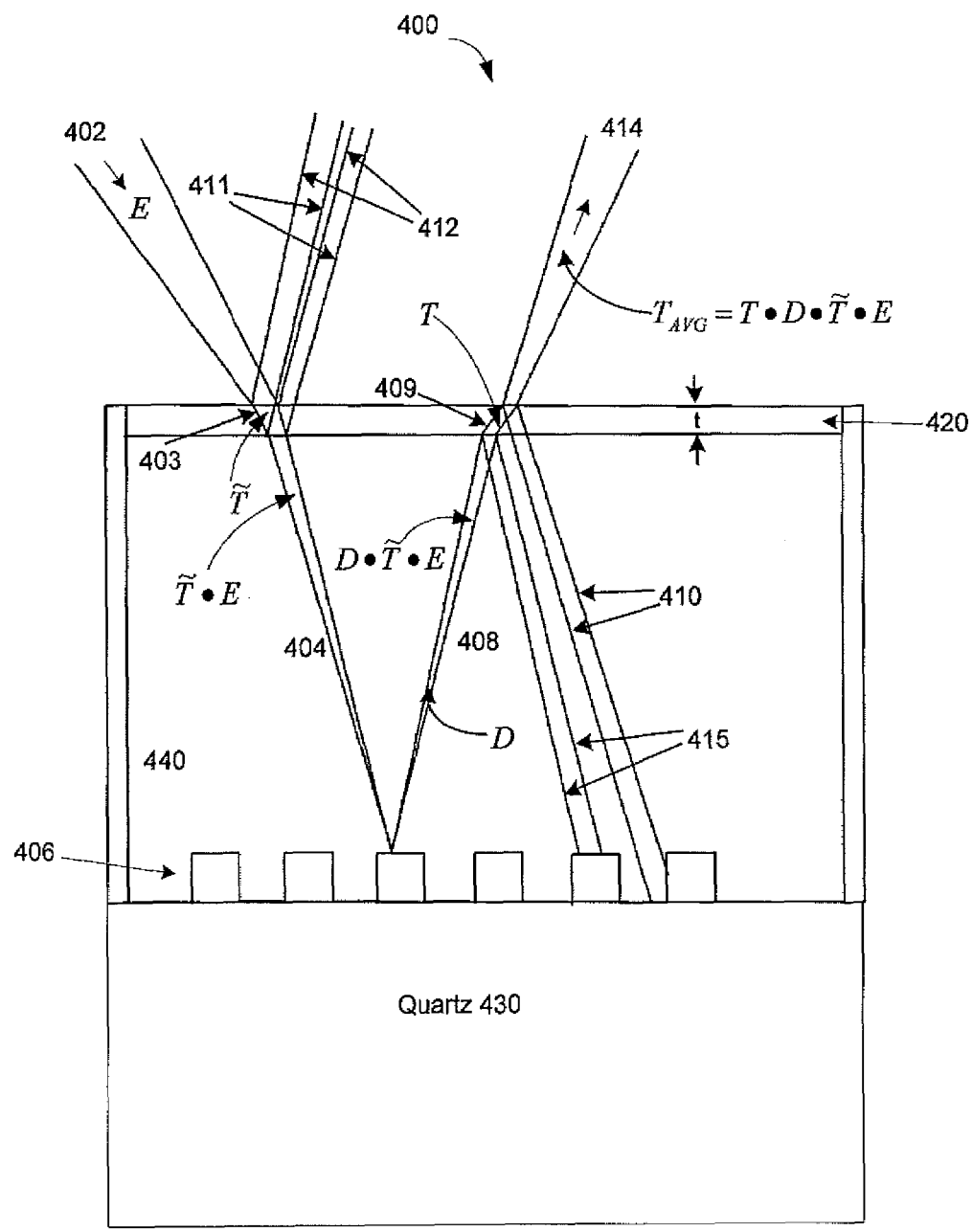
FIG. 3 is an exemplary architectural diagram of the optical model of a photomask covered with a pellicle.

FIG. 3 is an exemplary architectural diagram of the optical model of a photomask covered with a pellicle. The illumination beam 402 is directed through the pellicle 420 at an angle, which can be zero from normal. The illumination beam 402 strikes the upper surface of the pellicle 420 where part of the beam is reflected off the upper surface as beam 412. Part of the illumination beam passes through the pellicle 420 as beam 403 and strikes the lower surface of the pellicle 420. Part of the beam 403 going through the pellicle is reflected as beam 411 through the pellicle 420 and moves away from the surface of the pellicle 420. Part of the illumination beam 404 that is not reflected by the upper and lower surfaces of the pellicle goes through the medium 440 and strikes the photomask structure 406. The illumination beam that goes through the pellicle, beam 404, is determined by the thickness t of the pellicle 420 and the refractive indices, (refractive index, N, and extinction coefficient, K), of the pellicle, and the angle of incidence of the illumination 402.

Diffraction of the incident beam 404 is affected by the photomask structure and by the refractive indices of the materials used in the photomask structure 406. The signal off the photomask structure 406 is the detection beam 408. The detection beam 408 strikes the lower surface of the pellicle 420 and part of the detection beam 408 is reflected back to the photomask structure as beam 415. Part of the detection beam 408 goes through the pellicle material 420 as the beam 409 strikes the upper surface of the pellicle 420. Part of the detection beam 409 is reflected back to the photomask structure 420 as beam 410. Part of the detection beam 409 passing through the pellicle 420 proceeds to the detector (not shown) as beam 414. Beam 409 is determined by the thickness t of the pellicle 420, the refractive indices, (N and K), of the pellicle, and the angle of incidence of the detection beam 408.

The pellicle 420 may be a polymer film or a glass plate. The pellicle material is required to be transparent to the lithography wavelength. The medium 440 between the pellicle 420 and the photomask structure 406 is typically air but maybe a liquid. The photomask structure is typically fabricated on a quartz 430 plate. The detector may be a spectrometer. The photomask structure covered with a pellicle 400 may be measured with an optical metrology device such as a broadband reflectometer, a broadband ellipsometer, and the like.

Figure 4A:
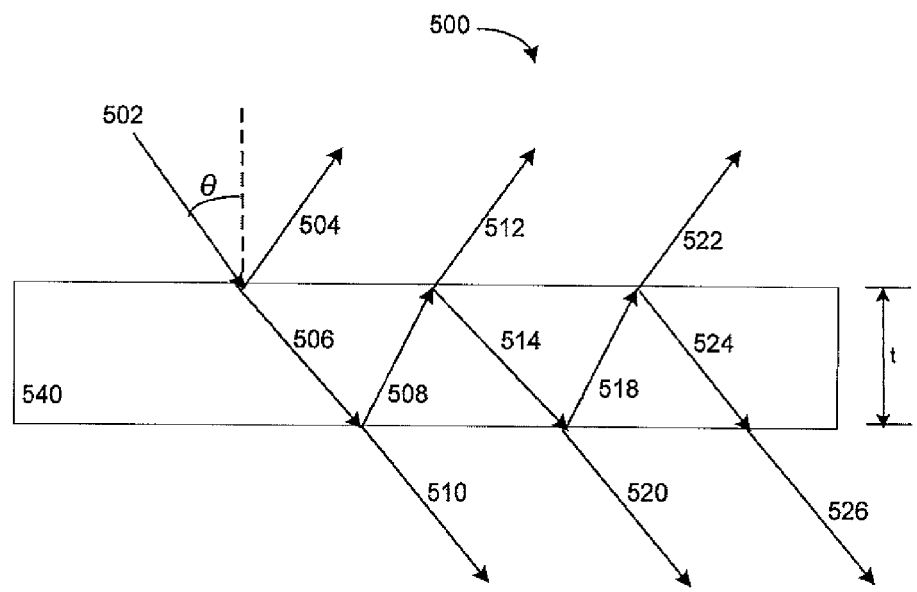
Figure 4B:
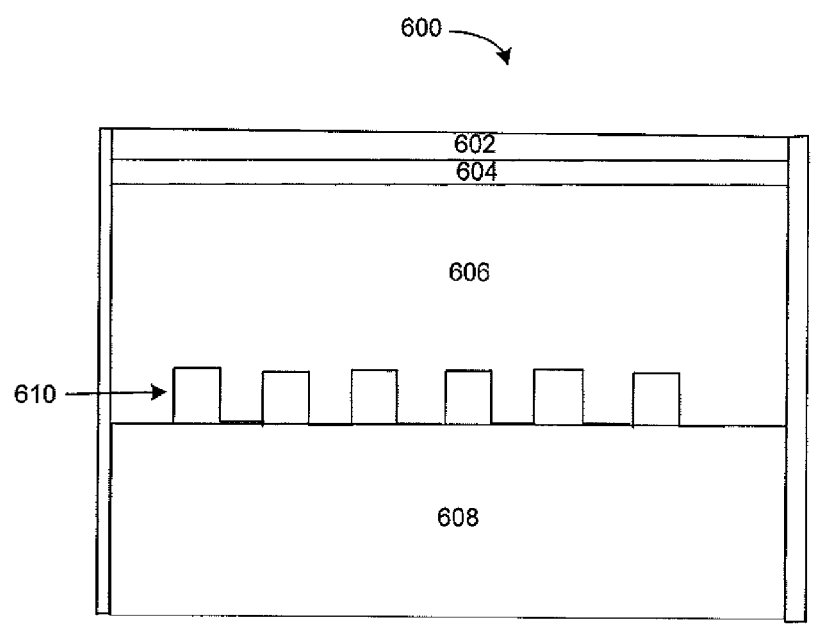
FIG. 4B is an exemplary architectural diagram of a photomask covered by more than one layer of the pellicle.

FIG. 4A is an exemplary architectural diagram of the optical model 500 of the pellicle 540 depicting more detail of the propagation process of the illumination beam 502. Illumination beam 502 at an angle of incidence θ hits the upper surface of pellicle 540 where part of the illumination beam is reflected as beam 504. As mentioned above, θ can be zero or greater than zero. As mentioned above, the incident beam 506 that goes through the pellicle is affected by the thickness t of the pellicle 540 and the N and K of the pellicle 540. The beam 506 going through the pellicle 540 is partially reflected back through the pellicle 540 when the beam 506 hits the lower surface of the pellicle 540. Similarly, the beam 508 that hits the lower surface of the pellicle 540 is partially reflected back as beam 514, the beam 514 getting partially reflected back as beam 518 to the upper surface of the pellicle 540. The process is repeated several times where the strength of the beam bouncing back and forth inside the pellicle diminishes after each iteration. FIG. 4B is an exemplary architectural diagram of a photomask covered by more than one layer of the pellicle. The layers of the pellicle may comprise two or more layers of polymer film or two or more glass plates. The photomask structure 600 is covered with two pellicle layers 602 and 604. As is well known in the art, the pellicle layers 602 and 604 are separated from the photomask structure 610 by the medium 606. As will be shown below, the optical modeling and equation for two or more layers of the pellicle are handled in a similar manner as calculations related to the propagation of light through thin film layers of wafer structures. For details of the calculations, refer to U.S. Pat. No. 6,891,626 CACHING OF INTRALAYER CALCULATIONS FOR RAPID RIGOROUS COUPLE-WAVE ANALYSIS, by Niu, issued on May 10, 2005, incorporated herein by reference in its entirety.

The equations for modeling the coherent and incoherent portions of the beam diffraction are discussed separately. Coherent beam calculations apply to the reflections of the illumination or detection beams being reflected at the beam hits the upper or lower surface of the pellicle. The basic reflectivity equation for a polarized beam is as follows:

$$R_{s,p} = \frac{r^{s,p} + r_1^{s,p} \cdot e^{i\phi}}{1 + r^{s,p} \cdot r_1^{s,p} \cdot e^{i\phi}} \quad (1.00)$$

where $$\phi = \frac{4\pi t}{\lambda} \sqrt{\varepsilon - \sin^2\theta}$$

t is the thickness of the pellicle, where $i = \sqrt{-1}$ and $\varepsilon = (n + ik)^2$ n and k are the refraction index and coefficient of extinction of the pellicle, θ is the AOI $r_1$ is the diffracted beam across the thickness of the pellicle $r_s$ is the reflectivity on the s component of a polarized beam $r_p$ is the reflectivity on the p component of a polarized beam.

Specific equations to get $r_s$, $r_p$ etc. are:

$$r_s = \frac{z_1 - z_2}{z_1 + z_2}$$

$$r_p = \frac{z_1/\varepsilon_1 - z_2/\varepsilon_2}{z_1/\varepsilon_1 + z_2/\varepsilon_2}$$

where:

$$z_1 = \sqrt{\varepsilon_1 - \sin^2\theta}$$

$$z_2 = \sqrt{\varepsilon_2 - \sin^2\theta}.$$

The reflection of the incident beam that hits the upper pellicle surface may or may not affect the spectrometer measurement depending on depth of focus of the beam and the angle of incidence (AOI). If a normal AOI beam is used, then the reflections are part of the measured diffraction signal off the photomask structure covered by the pellicle. If the beam has a non-normal AOI, then if the depth of focus is large, then the reflections are part of the measured diffraction signal off the photomask structure covered by the pellicle. Otherwise, the reflections are shifted so that these will not be part of the measurement.

The illumination and detection beams that travel through the medium 440 are modeled using the regular optical modeling methods described in the references above. Modeling for the reduction of beam intensity while passing through material layers and the medium is depicted in FIG. 3 by noting how the beam intensity changes. Referring to FIG. 3, the illumination beam 402 has a transmission E, after reflection on hitting the upper surface, the beam 402 has a transmission of Ŧ, and the beam moving through the medium 440, the transmission is Ŧ·E. The detection beam 408 has a transmission of D·Ŧ·E where D is the diffraction of the detection beam 408. The detection beam becomes the beam 409 with a transmission through the pellicle away from the photomask is A, and the detection beam 414 towards the spectrometer (not shown) has a transmission of $T_{AVG}$=T·D·Ŧ·E. The detection beam measured by the spectrometer as an average over the spectrometer resolution is:

$$\text{Measurement} = \sqrt{<|\tilde{T}||T^2|>} \cdot D \quad (1.10)$$

where D is the diffraction of the detection beam from the photomask structures,

T is the transmission through the pellicle when the light moves toward the photomask, and E is transmission through the pellicle when the light moves away from the photomask.

Figure 5:
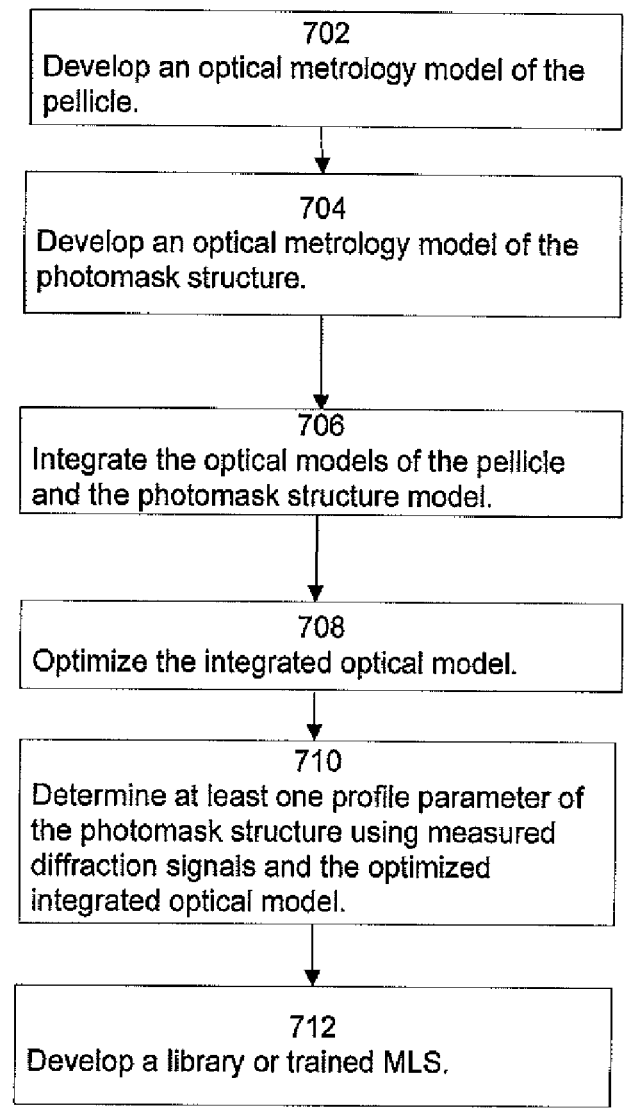
FIG. 5 is an exemplary flowchart for developing an optimized metrology model of photomask covered by a pellicle and for determining profile parameters of the photomask structure.

FIG. 5 is an exemplary flowchart for developing an optimized metrology model of photomask covered by a pellicle and for determining profile parameters of the photomask structure. In step 702, an optical metrology model of the pellicle is developed. Included in the model is the thickness of the pellicle, the N&K refractive indices, and the angle of incidence of the illumination beam or the detection beam. In step 704, the optical metrology model of the photomask structure is developed. The modeling process is similar to modeling of regular wafer patterned layers. In step 706, the optical models of the pellicle and the photomask structure model are integrated. Integration includes ensuring the model is seamlessly combined to facilitate simulation of the signal diffracted off the photomask structure covered with a pellicle. In step 708, the integrated optical model is optimized. For details on optimizing a model, refer to U.S. patent application Ser. No. 10/206,491, titled MODEL AND PARAMETER SELECTION FOR OPTICAL METROLOGY, filed on Jul. 25, 2002, which is incorporated herein by reference in its entirety. In step 710, measured diffraction signals and the optimized integrated optical model are used to determine at least one parameter of the photomask structure. The determined parameter may be compared to an acceptable range of values and flagged if outside the range. Determination of the parameters may be done using regression, a library, or a machine learning system. The optimized model may be used to develop a library of pairs of simulated diffraction signals and parameters of the photomask structure covered by the pellicle. Alternatively, a set of simulated diffraction signals and parameters of the photomask structure covered by the pellicle may be used to train a machine learning system to accept diffraction signals as input and generate parameters of the photomask structure covered with a pellicle as output.

Figure 6:
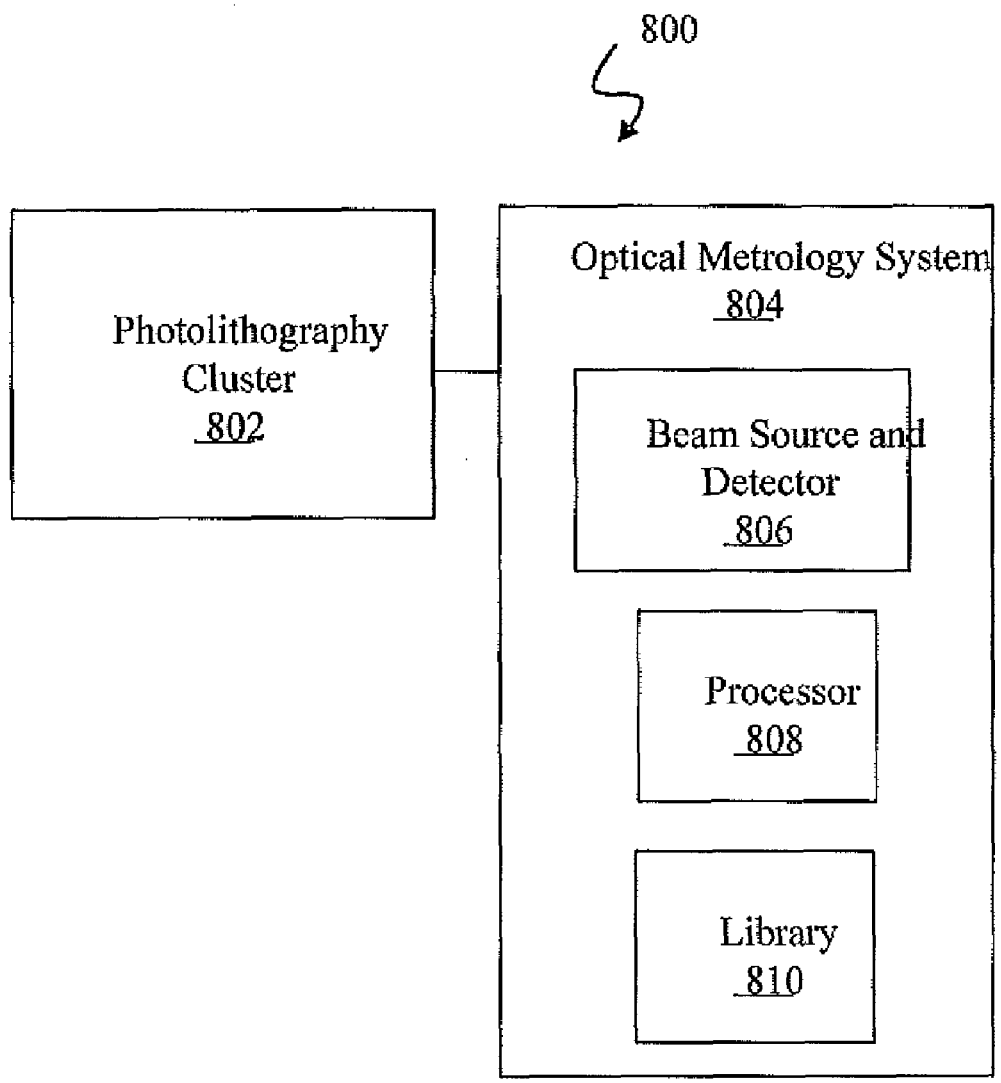
FIG. 6 is an exemplary block diagram of a system for utilizing a library developed for determining the profile parameters of photomask structure covered by a pellicle.

FIG. 6 is an exemplary block diagram of a system for utilizing a library developed for determining the profile parameters of photomask structure covered by a pellicle. In one exemplary embodiment, optical metrology system 804 can also include a library 810 with a plurality of simulated diffraction signals and a plurality of values of one or more photomask parameters associated with the plurality of simulated diffraction signals. As described above, the library can be generated in advance, metrology processor 808 can compare a measured diffraction signal off a structure to the plurality of simulated diffraction signals in the library When a matching simulated diffraction signal is found, the one or more values of the one or more photomask parameters associated with the matching simulated diffraction signal in the library is assumed to be the one or more values of the one or more photomask parameters.

Figure 7:
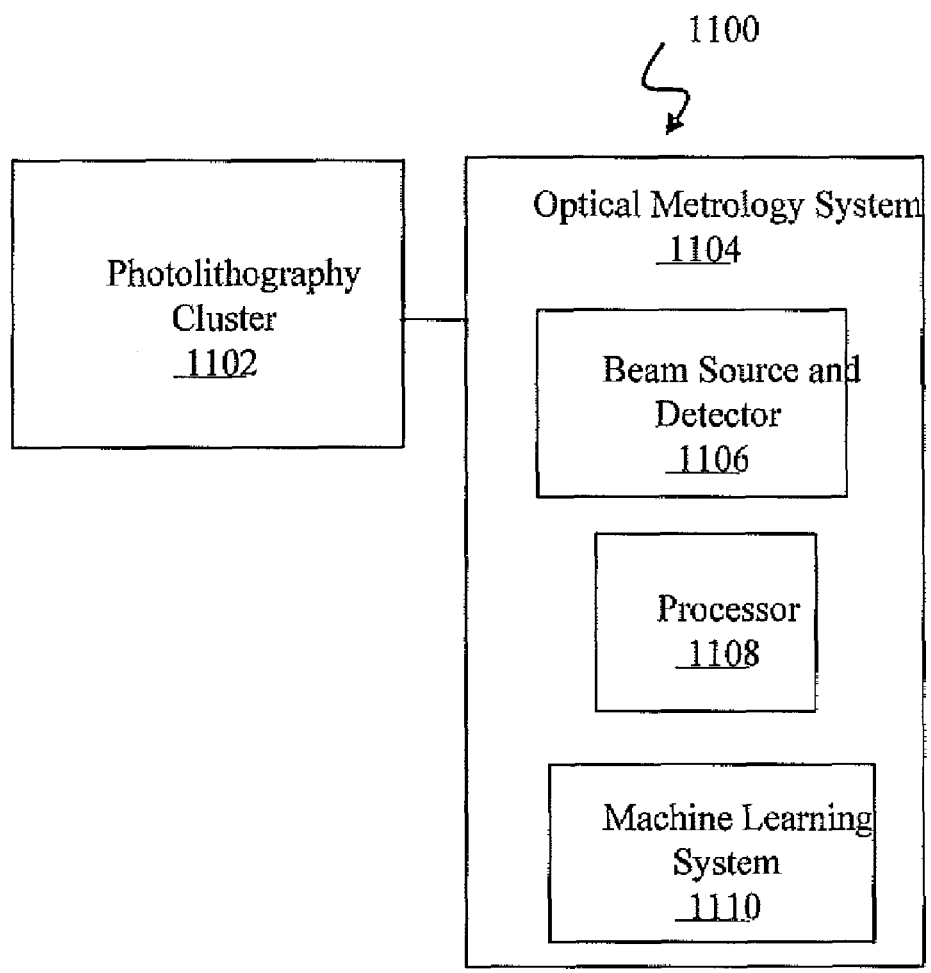
FIG. 7 is an exemplary block diagram of a system for utilizing a machine learning system developed for determining the profile parameters of photomask structure covered by a pellicle.

FIG. 7 is an exemplary block diagram of a system for utilizing a machine learning system developed for determining the profile parameters of photomask structure covered by a pellicle. System 1 100 includes a photolithography cluster 1102 and an optical metrology system 1104. Photolithography cluster 1102 is configured to perform a wafer application to fabricate a structure on a wafer. Optical metrology system 1104 includes a beam source and detector 1106, processor 1108, and machine learning system 1110. Beam source and detector 1106 can be components of a scatterometry device, such as a reflectometer, ellipsometer, and the like. Beam source and detector 1106 are configured to measure a set of diffraction signals off the photomask structure covered by a pellicle. Processor 1108 is configured to train machine learning system 1110 using the set of measured diffraction signals as inputs to machine learning system 1110 and the set of different values for the one or more photomask parameters as the expected outputs of machine learning system 1110.

After machine learning system 1110 has been trained, optical metrology system 1100 can be used to determine one or more values of one or more photomask parameters of a wafer application. In particular, a structure is fabricated using photolithography cluster 1102 or another photolithography cluster. A diffraction signal is measured off the structure using beam source and detector 1106. The measured diffraction signal is inputted into the trained machine learning system 1110 to obtain one or more values of one or more photomask parameters as an output of the trained machine learning system 1110.

Figure 8:
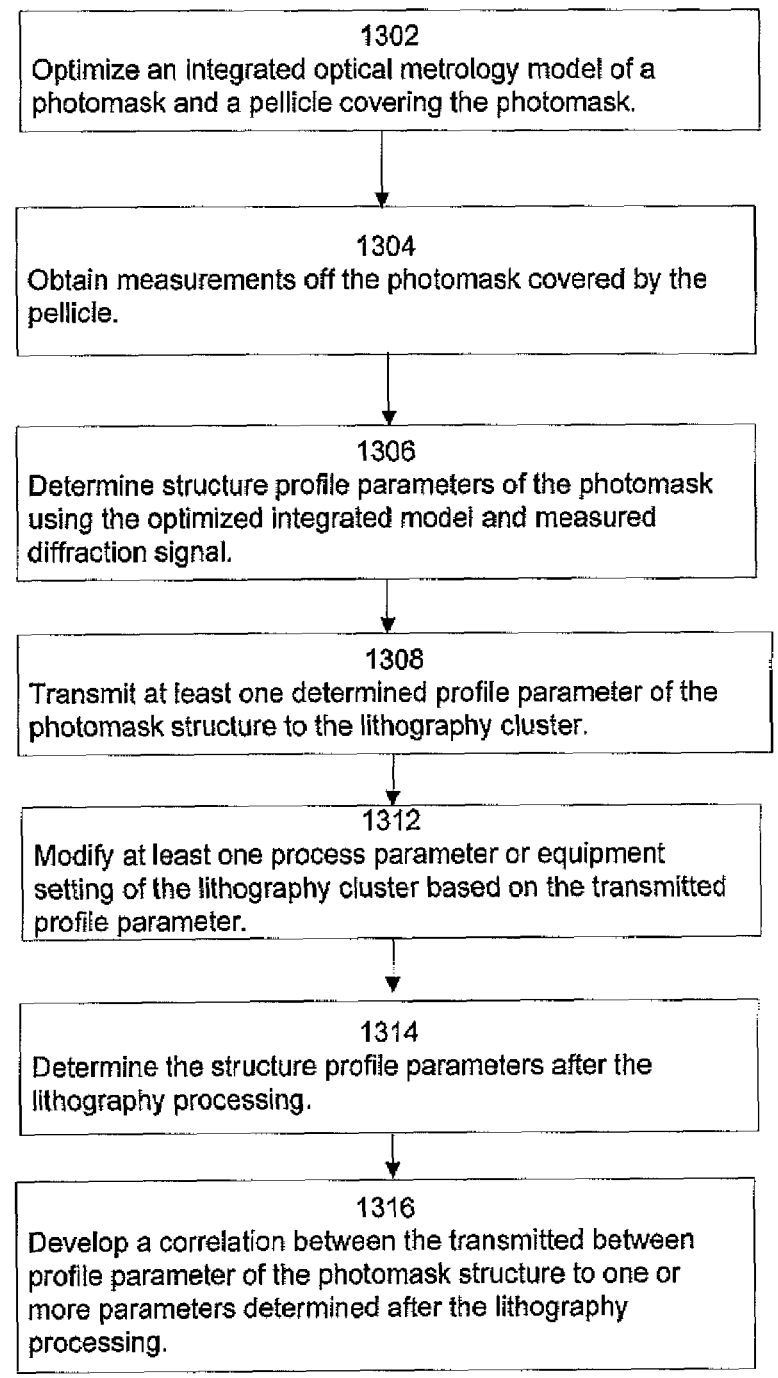
FIG. 8 is an exemplary flowchart for determining and utilizing metrology data for automated process and equipment control.

FIG. 8 is an exemplary flowchart for determining and utilizing metrology data for automated process and equipment control. In step 1302, an integrated optical metrology model of a photomask covered with pellicle is optimized. In step 1304, measurements off the photomask covered by the pellicle are obtained using an optical metrology device such as a reflectometer or an ellipsometer. In step 1306, the one or more profile parameters of the photomask structure is determined using the optimized diffraction signal and the measured diffraction signal. As mentioned above, determination of the one or more profile parameters may be done using the optimized optical metrology model and regression, or by using the optimized optical metrology model to create a library of pairs of simulated diffraction signals and set of profile parameters, or by the creating a trained machine learning system with measured diffraction signals as input and the one or more profile parameters of the photomask structure as output.

In step 1308, at least one determined profile parameter value of the photomask structure is transmitted to the lithography cluster. The lithography cluster may include fabrication equipment that utilizes the photomask structure for exposure, development, and thermal processes of a substrate with a resist layer. In step 1312, at least one process parameter or equipment setting of the lithography cluster based on the transmitted at least one determined profile parameter of the photomask structure. For example, a top CD or a bottom CD of the photomask structure may be transmitted to the photolithography cluster. The top CD or bottom CD value may be used as the basis for modifying the focus or dose of the exposure equipment or the temperature or length of baking in the post exposure baking process. After at least one process step in the lithography cluster is completed, in step 1314, the fabricated structure is measured using an optical metrology device, such as a reflectometer or an ellipsometer, or a CDSEM. In step 1314, at least one profile parameter of the fabricated structure is determined based on the measurement with the optical metrology device. In step 1316, a correlation is developed between the transmitted profile parameter of the photomask structure and one or more parameters determined after the lithography processing. For example, assume that a top CD of the photomask structure was transmitted to the lithography cluster. After an exposure and development process is performed on the resist in the lithography cluster, the resist structure profile is determined in step 1314. One or more determined profile parameter of the resist structure is correlated with the top CD of the photomask structure. This correlation may be used to adaptively change which process parameter or equipment setting is modified and by how much, in step 1312.

Figure 9:
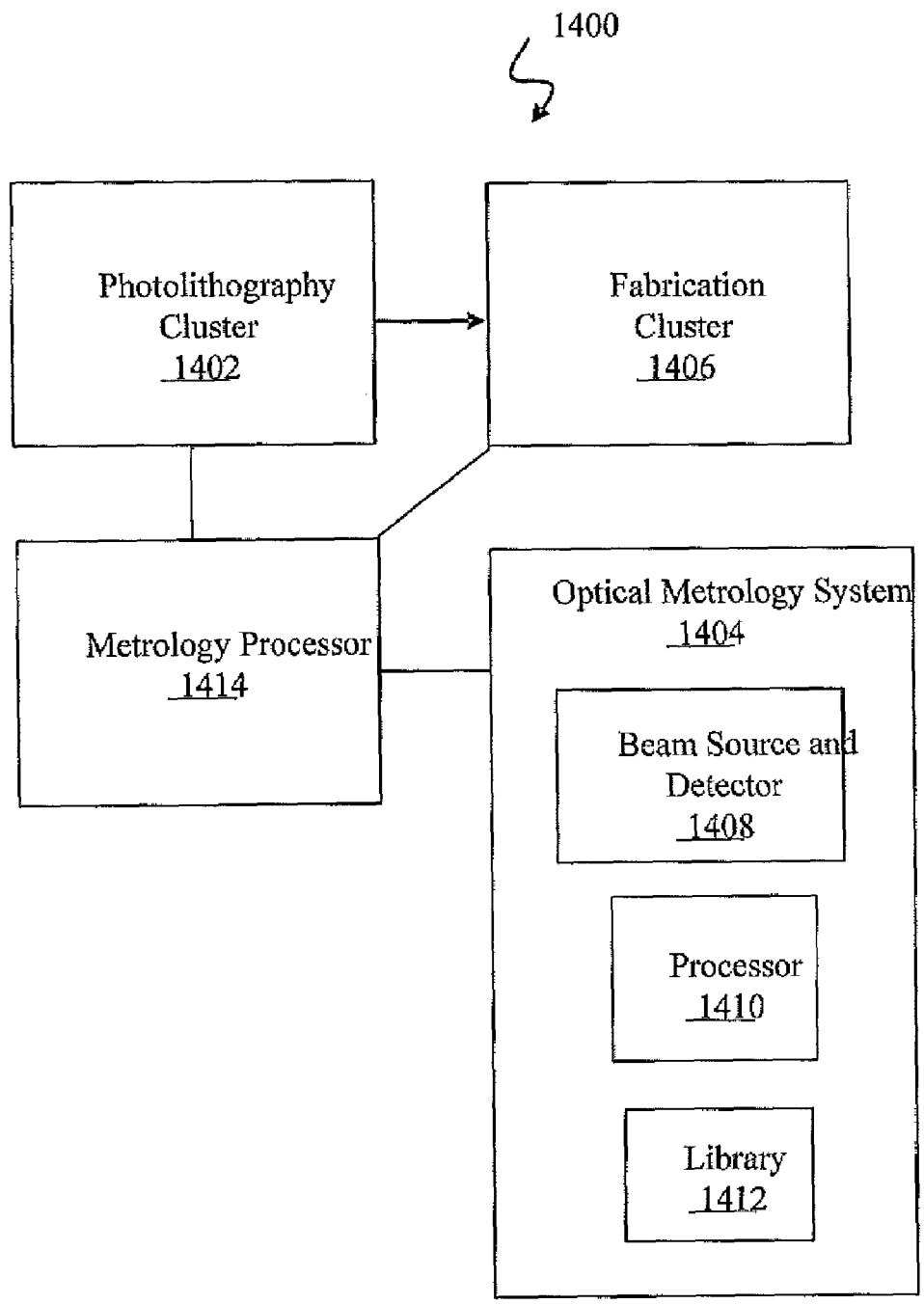
FIG. 9 is an exemplary block diagram for determining and utilizing metrology data for automated process and equipment control.

FIG. 9 depicts an exemplary system 1400 to control a photolithography cluster. System 1400 includes a photolithography cluster 1402 and optical metrology system 1404. System 1400 also includes a fabrication cluster 1406. Although fabrication cluster 1406 is depicted in FIG. 14 as being subsequent to photolithography cluster 1402, it should be recognized that fabrication cluster 1406 can be located prior to photolithography cluster 1402 in system 1400.

A photolithographic process, such as exposing and/or developing a photomask layer applied to a wafer, can be performed using photolithography cluster 1402. Optical metrology system 1404 is similar to optical metrology system 40 (FIG. 1A). In one exemplary embodiment, optical metrology system 1404 includes a beam source and detector 1408 and processor 1410. Beam source and detector 1408 are configured to measure a diffraction signal off the structure. Processor 1410 is configured to compare the measured diffraction signal to a simulated diffraction signal. The simulated diffraction signal was generated using one or more values of one or more profile parameters of the photomask structure. The one or more values of the one or more profile parameters used to generate the simulated diffraction signal were obtained from the one or more values of the one or more photomask parameters associated with the simulated diffraction signal. If the measured diffraction signal and the stored simulated diffraction signal match, one or more values of the photomask parameters in the fabrication application are determined to be the one or more values of the photomask parameters associated with the stored simulated diffraction signal.

In one exemplary embodiment, optical metrology system 1404 can also include a library 1412 with a plurality of simulated diffraction signals and a plurality of values of one or more photomask parameters associated with the plurality of simulated diffraction signals. As described above, the library can be generated in advance, metrology processor 1410 can compare a measured diffraction signal off a structure to the plurality of simulated diffraction signals in the library When a matching simulated diffraction signal is found, the one or more values of the one or more photomask parameters associated with the matching simulated diffraction signal in the library is assumed to be the one or more values of the photomask parameters used in the wafer application to fabricate the structure.

System 1400 also includes a metrology processor 1414. In one exemplary embodiment, processor 1410 can transmit the one or more values of the one or more photomask parameters to metrology processor 1414. Metrology processor 1414 can then adjust one or more process parameters or equipment settings of photolithography cluster 1402 based on the one or more values of the one or more photomask parameters determined using optical metrology system 1404. Metrology processor 1414 can also adjust one or more process parameters or equipment settings of fabrication cluster 1406 based on the one or more values of the one or more photomask parameters determined using optical metrology system 1404. As noted above, fabrication cluster 1406 can process the wafer before or after photolithography cluster 1402

Although exemplary embodiments have been described, various modifications can be made without departing from the spirit and/or scope of the present invention. Therefore, the present invention should not be construed as being limited to the specific forms shown in the drawings and described above.

We claim:

1. A method of controlling a photolithography cluster using a trained a machine learning system to determine photomask structure parameters of a photomask covered with a pellicle using optical metrology, the photomask being used to fabricate a structure on a wafer, the method comprising:
   a) obtaining a set of different values of one or more photomask structure parameters, the photomask covered with a pellicle;
   b) obtaining a set of diffraction signals using the set of different values of the one or more photomask structure parameters;
   c) training a machine learning system using the set of diffraction signals as inputs to the machine learning system and the set of different values of the one or more photomask structure parameters as expected outputs of the machine learning system;
   (d) obtaining a measured diffraction signal off an examined structure; and
   (e) after the machine learning system has been trained, inputting the measured diffraction signal into the machine learning system to obtain one or more values of one or more photomask structure parameters as an output of the machine learning system.

2. The method of claim 1 wherein obtaining the set of diffraction signals using the set of different values of the one or more photomask structure parameters comprises:

wherein the simulated diffraction signal is obtained using an optimized integrated optical metrology model developed as follows:
   (b1) developing an optical metrology model of the pellicle covering the photomask, the pellicle having first and second surfaces;
   (b2) developing an optical metrology model of the photomask, the photomask having a structure and separated from the pellicle by a medium, the photomask structure having profile parameters, the optical metrology model of the photomask including optical effects on an illumination beam transmitted through the pellicle and diffracted by the photomask structure, the diffraction generating a detection beam;
   (b3) integrating the optical metrology model of the pellicle and the optical metrology model of the photomask, generating an integrated optical metrology model; and
   (b4) optimizing the integrated optical metrology model.

3. The method of claim 2 wherein the optical metrology model of the pellicle comprises:
   developing a first optical metrology model of the pellicle, the first optical metrology model of the pellicle including optical effects on the illumination beam related to the first and second surfaces of the pellicle; and
   developing a second optical metrology model of the pellicle, the second optical metrology model of the pellicle including optical effects on the detection beam related to the first and second surfaces of the pellicle.

4. The method of claim 3 wherein the first optical metrology model of the pellicle covering the photomask includes optical effects on the illumination beam related to reflection off the first surface of the pellicle, refractive indices of the pellicle, and reflection of the illumination beam off the second surface of the pellicle.

5. The method of claim 3 wherein the second optical metrology model of the pellicle covering the photomask includes optical effects on the detection beam related to the reflection off the second surface of the pellicle, refractive indices of the pellicle, and reflection of the detection beam off the first surface of the pellicle.

6. The method of claim 2 wherein the first and second optical metrology models of the pellicle and the optical metrology model of the photomask include a reduction of the illumination beam or detection beam intensities due to reflection at the first and second surfaces of the pellicle.

7. The method of claim 2, wherein the obtained set of diffraction signals is generated utilizing a numerical analysis technique, including rigorous coupled-wave analysis, using the different values of the one or more photomask structure parameters and the integrated optical metrology model.

8. The method of claim 1 further comprising:
   adjusting one or more process parameters or equipment settings of a fabrication cluster based on the one or more values of the one or more obtained photomask structure parameters.

9. A computer-readable storage medium containing computer-executable instructions to control a photolithography cluster using optical metrology, comprising instructions for:
   a) obtaining a set of different values of one or more photomask structure parameters, the photomask covered with a pellicle;
   b) obtaining a set of diffraction signals using the set of different values of the one or more photomask structure parameters; and
   c) training a machine learning system using the set of diffraction signals as inputs to the machine learning system and the set of different values of the one or more photomask structure parameters as expected outputs of the machine learning system.

(d) obtaining a measured diffraction signal off the structure to be examined;

(e) after the machine learning system has been trained, inputting the measured diffraction signal into the machine learning system to obtain one or more values of one or more photomask structure parameters as an output of the machine learning system; and (f) adjusting one or more process parameters or equipment settings of a fabrication cluster based on the one or more values of the one or more obtained structure parameters.

10. A system to control a photolithography cluster using optical metrology, the system comprising:

a photolithography cluster configured to perform a photolithographic process to fabricate a structure on a wafer;

an optical metrology system comprising:

a beam source and detector configured to measure a diffraction signal off a photomask structure covered with a pellicle;

a processor connected to the beam source and detector, wherein the processor is configured to compare the measured diffraction signal to a simulated diffraction signal off the photomask structure, wherein the simulated diffraction signal is associated with one or more values of one or more photomask structure parameters, wherein the simulated diffraction signal was generated using one or more values of one or more photomask structure parameters; and a metrology processor coupled to the optical metrology system and the photolithography cluster, wherein the metrology processor is configured to adjust one or more process parameters or equipment settings of the photolithography cluster based on the one or more values of the one or more photomask structure parameters determined by the processor of the optical metrology system.

11. The system of claim 10, further comprising:

a library having a plurality of simulated diffraction signals and a plurality of values of one or more photomask structure parameters associated with the plurality of simulated diffraction signals.

12. The system of claim 10 further comprising:

a machine learning system trained to use the set of diffraction signals as inputs to the machine learning system and the set of different values of the one or more photomask structure parameters as expected outputs of the machine learning system.

13. The system of claim 10 wherein the processor of the optical metrology system is configured to determine the photomask structure parameters using regression.

14. The system of claim 10 wherein the processor of the optical metrology system is configured to use an optimized integrated optical metrology model of the photomask structure covered with the pellicle, the integrated optical metrology model developed as follows:

developing an optical metrology model of a pellicle covering the photomask, the pellicle having first and second surfaces;

developing an optical metrology model of the photomask, the photomask separated from the pellicle by a medium and having a structure, the photomask structure having profile parameters, the optical metrology model of the photomask including optical effects on an illumination beam transmitted through the pellicle and diffracted by the photomask structure, the diffraction generating a detection beam;

integrating the optical metrology model of the pellicle and the optical metrology model of the photomask, generating an integrated optical metrology model; and optimizing the integrated optical metrology model.

* * * * *